US009458969B2

(12) United States Patent
Prester et al.

(10) Patent No.: US 9,458,969 B2
(45) Date of Patent: Oct. 4, 2016

(54) CRYOSTAT WITH PTR COOLING AND TWO STAGE SAMPLE HOLDER THERMALIZATION

(75) Inventors: Mladen Prester, Zagreb (HR); Duro Drobac, Zagreb (HR)

(73) Assignee: Institut za fiziku, Zagreb (HR)

( * ) Notice: Subject to any disclaimer, the term of this patent is extended or adjusted under 35 U.S.C. 154(b) by 606 days.

(21) Appl. No.: 14/005,676

(22) PCT Filed: Feb. 23, 2012

(86) PCT No.: PCT/HR2012/000004

§ 371 (c)(1),
(2), (4) Date: Sep. 17, 2013

(87) PCT Pub. No.: WO2012/127255

PCT Pub. Date: Sep. 27, 2012

(65) Prior Publication Data

US 2014/0007596 A1 Jan. 9, 2014

(30) Foreign Application Priority Data

Mar. 22, 2011 (HR) ............................ P 20110205 A

(51) Int. Cl.
*F17C 13/00* (2006.01)
*F25B 9/14* (2006.01)
(Continued)

(52) U.S. Cl.
CPC ................ *F17C 13/00* (2013.01); *F25B 9/10* (2013.01); *F25B 9/14* (2013.01); *F25B 9/145* (2013.01); *F25D 19/006* (2013.01)

(58) Field of Classification Search
CPC ...... F25B 9/14; F25B 9/145; F25B 2500/19; F25D 19/006
See application file for complete search history.

(56) References Cited

U.S. PATENT DOCUMENTS 4,432,216 A * 2/1984 Matsuda .................. F25B 9/10
62/51.1
5,323,112 A * 6/1994 Howard ................ G01R 33/30
324/318
(Continued)

FOREIGN PATENT DOCUMENTS

| | | | |
|---|---|---|---|
| EP | 0 905 524 | B1 | 12/2004 |
| WO | WO 03/023433 | A1 | 3/2003 |
| WO | WO 03/036190 | A1 | 5/2003 |

OTHER PUBLICATIONS

Hilton et al., "Fully portable, highly flexible dilution refrigerator systems for neutron scattering," Revue Phys. Appl. Sep. 19, 1984, pp. 775-777.

(Continued)

*Primary Examiner* — Frantz Jules
*Assistant Examiner* — Brian King
(74) *Attorney, Agent, or Firm* — RatnerPrestia

(57) ABSTRACT

A cryostat with a PTR cooling and a boiling fluid medium including a two stage sample holder thermalization, especially convenient for AC susceptibility measurement; wherein: a 1st PTR stage is connected to a recondenser with a thermal link only; the recondenser partially penetrates through the walls of a chamber into a dewar region above a boiling fluid level, wherein the recondenser includes an integrally built thermalization point with the internal thread; whereby a 2nd PTR stage thermally connected to the thermalization block by the use of a non-flexible thermal link, wherein said thermal block includes an another thermalization point. The thermalization block enables relative vertical movement of a sample holder with respect to the cryostat without loss of excellent thermal contact with the thermalization point. Outside the vacuum chamber there are magnetic coils immersed in the boiling fluid, thus achieving substantial reduction of the parasitic effects in measurements.

11 Claims, 7 Drawing Sheets

(51) Int. Cl.
*F25B 9/10* (2006.01)
*F25D 19/00* (2006.01)

(56) References Cited

U.S. PATENT DOCUMENTS

| | | | | |
|---|---|---|---|---|
| 5,611,207 | A | 3/1997 | Hess | |
| 5,744,959 | A | 4/1998 | Jeker et al. | |
| 2003/0122543 | A1* | 7/2003 | Shirakawa | G01R 33/02 324/248 |
| 2005/0202976 | A1* | 9/2005 | Killoran | G01R 33/3815 505/200 |
| 2008/0098752 | A1* | 5/2008 | Hohne | F25B 9/145 62/51.1 |
| 2010/0109666 | A1* | 5/2010 | Armbruster | G01R 33/307 324/318 |

OTHER PUBLICATIONS

International Search Report for PCT/HR2012/000004 mailed Sep. 27, 2012.
Written Opinion of International Searching Authority for PCT/HR2012/000004 mailed Sep. 27, 2012.

* cited by examiner

CRYOSTAT WITH PTR COOLING AND TWO STAGE SAMPLE HOLDER THERMALIZATION

CROSS REFERENCE TO RELATED APPLICATIONS

This application is the U.S. National Phase Application of PCT/HR2012/000004, filed Feb. 23, 2012, which claims priority to Croatian Patent Application No. P20110205A, filed Mar. 22, 2011, the contents of such applications being incorporated by reference herein.

FIELD OF INVENTION

The present invention relates to the construction of a cryostat cooled with the PTR device (PTR—pulse tube refrigerator) comprising additional thermal stabilization, as realized by the use of a liquid fluid and a two-stage sample holder thermalization. Application of the subject invention is in solid state physics measurements, in particular in studies of thermal dependence of ac susceptibility.

BACKGROUND OF INVENTION

Cryostats integrating PTR cooling are usually designed such that no liquid cryogen is present in their operation—the absence of liquid cryogen represents their main advantage over the standard bath cryostats. Standard bath cryostats use one or more types of liquefied gases of various boiling temperatures in their operation. The subject invention combines all advantages of standard cryostats with the advantages of the PTR-based cryostats. The invention is intended for measurements in solid state physics, in particular of AC susceptibility.

PRIOR ART

Since the introduction of the PTR-based cooling in mid 90-ties of the last century the related patent literature rapidly grows. A document EP-B-0905524, filed in 1998 (STAUTNER, Wolfgang Ernst), describes application of the PTR-based technique in a NMR system comprising magnetic section of the system situated in a cryogenic fluid. The said document is related to the subject invention only in the choice of the PTR technique for active cooling of certain cryostat's components and in the idea of positioning the vital components into the cooling fluid. In said document the vital component is superconducting magnet while in the subject invention the vital component is a system of AC susceptibility measuring coils. In said document the reason for situating the superconducting coil into the cryogenic fluid is in reaching the superconducting state of the coil. In the subject invention the reason for having AC susceptibility measuring coils immersed in the boiling cryogenic fluid is in reaching a temperature-independent residual off-set voltage (the coil miss-balance) and in achieving a temperature-independent phase relationship between the applied and the induced signal. Thus, EP-B-0905524 can be considered only as a document defining generally the field of application of the PTR technique.

Document US-A-20080098752, derived from the international patent application PCT/EP2005/056315 (HOHNE, Jens) elaborates a low-temperature cryostat with (preferably) the two-stage PTR cooling technique intended for applications in sample microscopy. According to the cryostat design said document represents the closest prior art.

The subject invention, however, introduces better precooling options, better thermal contact between the sample holder and the PTR cooler, and, most importantly, positioning of the measuring AC susceptibility coils into the boiling cooling fluid at the fixed temperature. Document US A-20080098752 does not elaborate the problem of thermal contacts, especially not the ways of their practical realizations and adjustments, as well as it does not elaborate the question of sample positioning. The latter problems are all solved within the subject invention.

The document Hilton, P. A., Kerley M. W., Revue Phys. Appl. 19 (1984) 775-777, "Fully portable, flexible dilution refrigerator systems for neutron scattering" elaborates the design of the cooling system accommodated to the specific applications in neutron scattering, involving 'Cu—Cu screw' as a detachable thermal link. There are multiple differences between the latter mentioned detachable thermal link and the thermal links used in the subject invention. In the case of sample holder as described in the Prior Art the holder is used just for placing the sample in (and taking it out) the cryostat, its construction thus not applying nor attempting any positioning of the sample. The means how the sample holder precooling is designed and realized are also significantly different in the latter document and in the subject invention.

SUMMARY OF INVENTION

The first technical problem solved by the subject invention relates to the design of the two stage PTR-based cryostat for sample holder cooling with efficient sample holder precooling wherein its construction enables adjustment of the relative position of the sample with respect to the cryostat, namely with respect to the measuring coils, in the particular case of AC susceptibility measurements.

The second technical problem solved by the subject invention relates to the positioning of the measuring coils for AC susceptibility measurements in a physical position within the cryostat enabling thermal insulation from the sample holder such that the measuring coils are simultaneously thermalized by the boiling cryogen. This solution minimizes the problem of parasitic effects in AC susceptibility measurements as well as it eliminates the unwanted temperature dependence of the applied field/induced voltage phase relationship.

The third technical problem solved by the subject invention relates to the additional use of PTR cooling for recondensation of the boiling cryogen in order to reduce the cryogen consumption and to enhance the device autonomy.

In order to solve and/or to avoid the mentioned technical problems a PTR-based cryostat has been designed employing the PTR cooling but also a two-stage thermalization of the sample holder.

The cryostat consists of: a dewar, a vacuum chamber and a two-stage PTR-based unit, which is in part positioned inside the vacuum chamber. The vacuum chamber is partially immersed inside a boiling cryogenic fluid. Inside the vacuum chamber there are situated:

- a PTR cooler/1st stage, thermally linked to a recondenser, cross-sectioning the vacuum chamber wall in the dewar region above the fluid level, where the recondenser comprises an integral thermalization point; and
- a PTR cooler/2nd stage, thermally linked to a thermalization block via a non-flexible thermal link, where the thermalization block comprises the integral thermalization point and enables adjustment of the vertical position of the sample holder with respect to cryostat without breaking the thermal contact.

Outside the vacuum chamber, but inside the boiling fluid, is situated a measuring coil system, positioned coaxially with a closed tube, the interior of which extends the vacuum chamber, so that these two tubes make a single body.

In the simplest embodiment the thermalization block consist of the thermalization point directly connected to the 2nd PTR stage, by the use of the non-flexible thermal link, whereas the thermalization point comprises either a sliding contact surface or an appropriate internal thread.

In a more complicated embodiment the thermalization block consists of the thermalization point comprising the threaded body connected to the non-flexible thermal link being in thermal contact with the 2nd PTR stage by the use of an elastic thermal link. The latter embodiment enables relative positioning of the thermalization point with respect to the cryostat.

In even more complicated embodiment the thermalization block consists of the thermalization point comprising the threaded body inside a movable tube such that the tube and the thermalization point can move together but only axially inside the guiding tubes and relatively to the cryostat. The thermalization point is connected to the non-flexible thermal link being in thermal contact with the 2nd PTR stage by the use of a flexible thermal link.

Depending on the design of the thermalization block the cryostat is equipped with a compatible sample holder comprising: a sample holder body, a manipulation handle and a sample-accommodating sample holder top accepting the sample. There are two thermalization points realized as a separate part extending the sample holder body. Sample holder's thermalization points are compatible with the thermalization point in the recondenser and in the cryostat's thermalization block.

In all versions, construction of the cryostat and the sample holder enables adjustment of the relative position of the sample with respect to the measuring coils by several means, representing an important requirement in AC susceptibility measurements.

DESCRIPTION OF DRAWINGS

FIG. 5 shows a part of the cryostat accepting movable thermalization block shown in the FIG. 6 in order to realize the construction shown in the FIG. 7. FIG. 8 shows one of the possible technical solutions preventing radial rotation of the thermalization block.

DETAILED DESCRIPTION OF INVENTION

Figure 1:
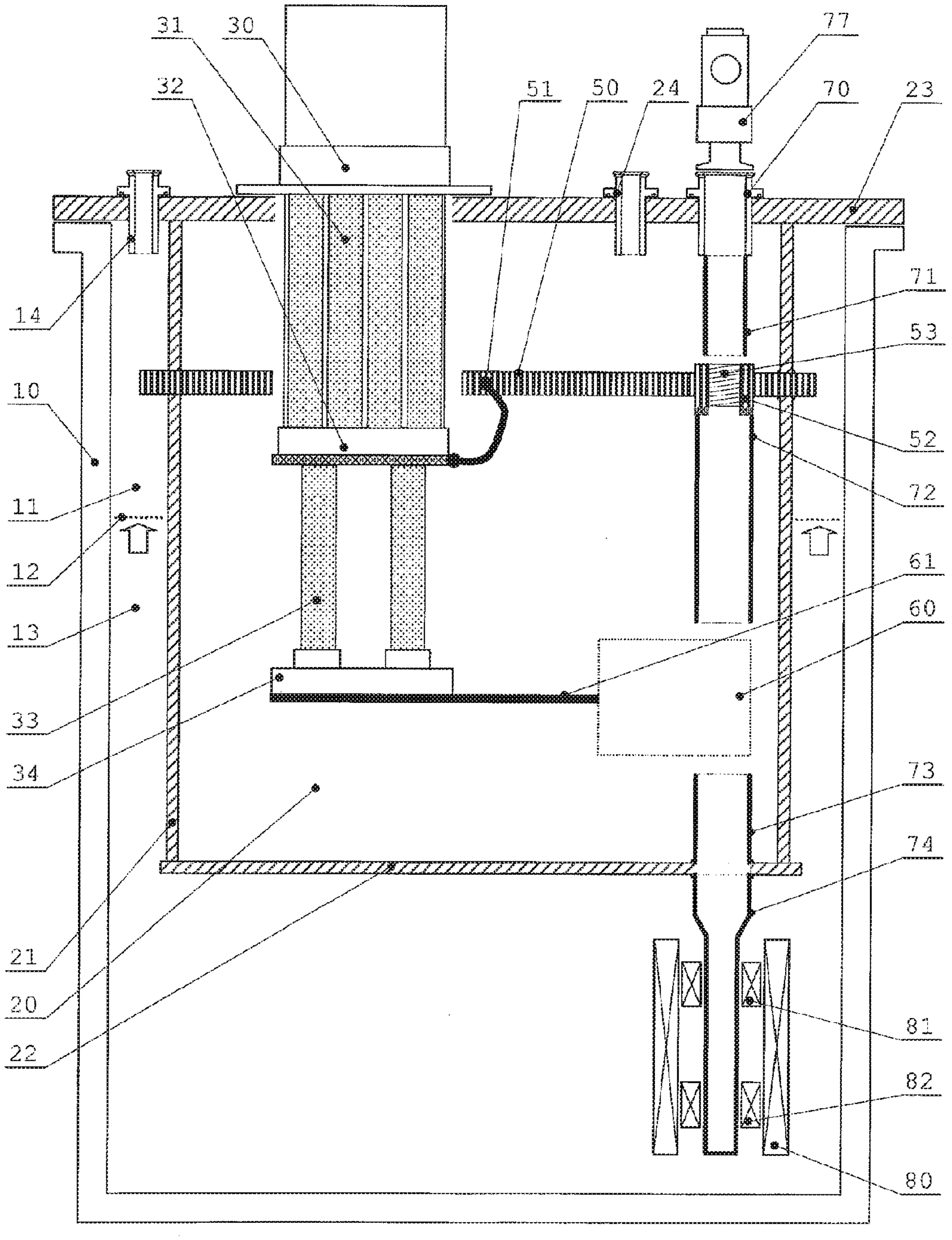
FIG. 1 shows the position of the elements forming the cryostat schematically.

The subject invention—cryostat—solving the previously listed technical problems, consists of a standard Dewar vessel (known also as a 'Dewar Flask'). The vessel is realized following any of the conventional prior art designs and enables proper thermal isolation of the dewar interior from the ambient. Inside the dewar (10) there is a boiling fluid (13) topped-up in a quantity such that above its surface (12) there is a well-defined space (11), as designated in the FIG. 1. As fluid the subject invention uses liquid nitrogen, but in said invention other suitable fluids can be used as well. The main role of the fluid (13) is not cooling of a vacuum chamber (20) but, as it will be clarified later on, thermalization of the coils used in AC susceptibility measurement, which important in order to assure a constant temperature of the coils in the course of the measurements.

The dewar (10) is sealed on its top in some of the standard ways known in Prior Art e.g., by using an appropriate vacuum chamber flange (23). A low heat conduction material, e.g., fibreglass, is used for construction of the flange (23).

Besides its role in closing the dewar the flange (23) simultaneously forms the top surface of the vacuum chamber (20), consisting of the walls (21) and a vacuum chamber bottom (22). Covering the walls (21) and the vacuum chamber bottom (22) facing the fluid with the radiation-reflecting radiation shields (made of, e.g., aluminium foil) is recommended.

Use of the radiation shields in reduction of the heat input from ambient into the vacuum chamber is well-known in Prior Art and the subject invention applies this measure in a standard way.

The vacuum chamber (20) walls (21) and its bottom (20) are partially immersed in the boiling fluid (13), as designated in FIG. 1. The vacuum chamber walls (21) and its bottom (20) are constructed out of a low heat conduction material. The material used for the vacuum chamber (20) has to withstand cooling down to cryogenic temperatures experiencing no cracking during numerous thermal cycling (repeated cooling-heating cycles). The latter material has to enable gluing of the components, like components of the vacuum chamber (20); the vacuum chamber bottom (22) to its walls (21), the walls (21) to the recondenser (50), as well as other components. In making these glued joints their vacuum tightness has to be preserved even after numerous thermal cycles. A composite material, glass reinforced epoxy (fibreglass), satisfies all of these requested requirements, with the components glued using commercially available glues like STAYCAST® or MASTER BOND®.

A tube (14), protruding out of the flange (23), enables contact with region (11) above the fluid surface. The role of the tube (14) is multifunctional; from transfer of the liquid fluid into the dewar to optional evacuation of the region (11) above the fluid level (12), in order to put pressure of the boiling fluid, thus its temperature, under external control. If necessary, the practical design can involve several tubes (14) protruding out of the flange (23). On the flange (23) there is also another tube (24), intended for evacuation of the vacuum chamber (20). Properly evacuated, the vacuum chamber (20) enables the elements residing in its interior, but otherwise not in direct mechanical contact, to be perfectly thermally isolated one from another. On the flange (23) there are special drilled ports housing a PTR head (30) and a sample holder port tube (70), penetrating into the vacuum chamber space (20), see FIG. 1. The joint between the PTR head (30) and the flange (23) is made vacuum-tight by some means known in Prior Art. Equally, a joint between a sample holder tube (70) and the flange (23) is vacuum tight by some means known in the Prior Art, e.g., by gluing with appropriate adhesives or tightening by appropriate screws and gaskets/o-rings. The sample holder tube (70) is extended by a guiding tube (71), realized out of a low heat-conducting material, e.g., fibreglass. The role of the guiding tube is to direct the sample holder during its way down to the thermalization point (52), the role and the position of which will be described latter on.

The main active functional element in the cooling system of this invention is the PTR unit (30), known in Prior Art; see, e.g., Oxford Magnet Technology Ltd.'s PTR unit as described in the international patent application PCT/EP2002/011882 and published as WO03036190A1. The 1st stage heat exchanger/regenerator chamber (31) connects a PTR head (30) with a PTR's 1st stage plate (32). 1st stage plate (32) is connected using a high thermal conduction link (51) with a recondenser (50). The thermal link (51) can be realized by the use of cooper braid or other similar thermally conducting materials in the form enabling damping of mechanical vibrations. Out of the 1st stage (32) there extends a 2nd stage heat exchanger/regenerator chamber (33) that ends with the $2^{nd}$ stage plate (34). By the use of a non-flexible thermal link (61), e.g., non-bending copper stripe, the 2nd stage is connected to a thermalization block (60). Typical temperatures achieved by the presently available PTR units are approximately 60 K for the 1st, and 2-4 K for the 2nd stages, respectively. In this way the temperatures of the PTR's 1st stage (32) and the 2nd stage (34) is approximately the same as the temperatures of the recondenser (50) and the thermalization block (60), respectively.

It is assumed that at the thermalization site there is no heat input bigger than the PTR's built-in cooling power, as determined by the available compressor power and its thermodynamic characteristics.

Inside the vacuum chamber (20), elevated approximately for the half-height of the vacuum chamber (20), there is, parallel to the vacuum chamber bottom (22), the recondenser (50). Its shape entirely reproduces the shape of the vacuum chamber (20), FIG. 1. The bores drilled in the recondenser (50) enable free passage of the parts of the PTR unit as said drilled bores are geometrically wider of the protruding PTR parts such that they do not form any mechanical or thermal contact with the recondenser (50) body. External diameter of the recondenser (50) is wider than the diameter of the vacuum chamber wall (21) thus resides partially in the region (11) above the surface (12) of the fluid (13). Recondenser (50) is made out of a high thermal conductivity material, such as copper or its alloys. The role of the recondenser (50), as situated in the region (11), is to recondense the evaporated cryogenic fluid (13), minimizing the fluid consumption in view of the recondenser temperature, kept colder than the boiling fluid temperature. The cooling of the recondenser body is achieved by the action of the 1st PTR stage (32).

The third technical problem of the subject invention is, accordingly, simultaneously solved: Integral with the recondenser body (50) there is a thermalization point (52) comprising an internal thread (53), which is realized by one of the means known in Prior Art. The term 'integral with the body' means that the thermalization point (52) is realized, e.g., by boring and threading the recondenser (50) body directly, or by welding, soldering or by using some other means of making proper thermal contact, the internally threaded (53) thermalization point (52) with the recondenser (50), such that the thermalization point (52) and the recondenser (50) form together an inseparable thermal body.

Thermalization point (52) is positioned strictly vertically below the sample holder tube (70), namely its guiding tube (71), in such a way that there is a free space between the guiding tube (71) bottom and the thermalization point (52), in order to prevent heat flow to the recondenser (50), thus its heating in the thermalization point (52) area. Beneath the thermalization point (52) there is an integrally built-in (e.g., by gluing) guiding tube (72). Its role is in guiding the sample holder on its way from the thermalization point (52) down to the thermalization block (60), which is connected by the non-flexible thermal link (61) to the 2nd PTR stage (34). The guiding tube (72) is also made out of the low heat conduction material, e.g. fibreglass, preferably in the cylindrical geometry. Beneath the thermalization block (60) there is a guiding tube (73) coaxial with another tube, closed at the bottom side, protruding through the vacuum chamber (22) bottom. The guiding tube (73) and the tube (74) can be arranged separately or as one unit, having together a role of guiding the sample holder into the range of magnetic coils (80, 81, 82), situated outside the vacuum chamber (20). Similarly to other mentioned guides, the guiding tube (73) and the closed tube (74) are made of the low heat conduction material, e.g., fibreglass, while the part of the closed tube (74) is constricted in its diameter in order to enable physical positioning of the tube inside the measuring coils (81,82). Additionally, said tube (74) has to be vacuum tightly joined with the vacuum chamber (20) bottom—following one of the previously described means—as it forms, by its interior, an integral part of the vacuum chamber (20) while with its outer surface it is immersed in the boiling fluid (13).

The coil for magnetic field forming (80) and the measuring coils (81, 82) are permanently immersed in the boiling fluid (13) at some well-defined temperature, which depends on the pressure inside the dewar (10). Then latter condition substantially contributes to the reduction of the parasitic effects in AC susceptibility measurements enabling also the phase relationship between the applied and induced signal to be independent on temperature variations of the sample or the sample holder with respect to the fixed temperature of the coils.

The sample temperature inside the vacuum chamber (20) can be arbitrary varied without thermal influence on the fluid (13), assuming good vacuum thermal insulation, absence of mechanical contacts and low heat conduction materials used in the guiding tube (73) and the tube (74) constructions. Magnetic coils are fixed in the dewar (10) space by some means known in the prior art.

The second technical problem is thus also entirely solved.

In accordance with the subject invention, thermalization block (60) can be realized by different means. Hereby, three most practical embodiments are shown together with one mode of application using an appropriate sample holder.

Embodiment 1

Figure 2:
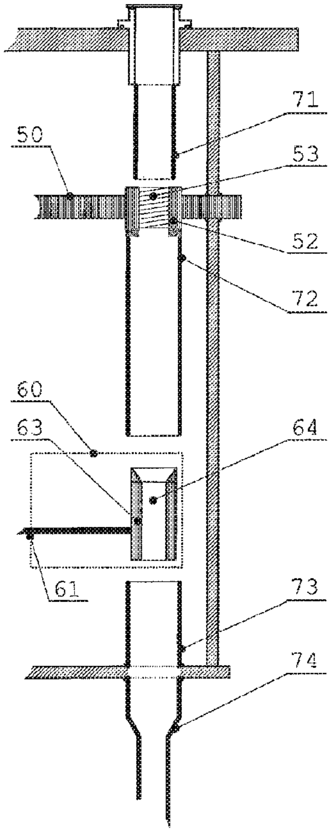
FIG. 2 shows the first embodiment of the immobile thermalization block comprising the sliding surface.

FIG. 2 shows the first embodiment of the thermalization block (60) according to the subject invention. The non-flexible thermal link (61) directly connects the thermalization point (63). Preferably, the thermalization point (63) is in the form of a copper cylinder, involving conical port facing the guiding tube (72), positioned exactly beneath said guiding tube (72) and involving an axial bore with a sliding contact surface (64).

Figure 3:
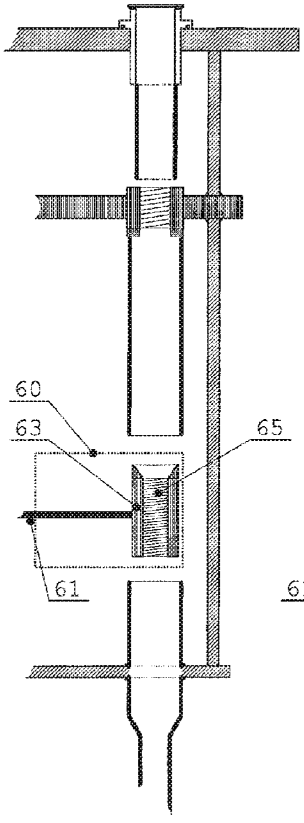
FIG. 3 represents a version of the first design with an immobile thermalization block but comprising a screw contact instead of the sliding surface.

FIG. 3 shows a version of the same embodiment of the thermalization block (60) according to the subject invention, differing in the thermalization point (63) additionally equipped with an internal thread (65) instead of the sliding surface (64).

In Embodiment 1, irrespective of the version, a relative physical movement of the thermalization block (60) with respect to the guiding tubes (72) or (73) is not possible, while the guiding tubes (71, 72, 73) and the thermalization point (63) are positioned along the same vertical axis extending from the sample holder tube (70) down to the space in-between the coils (81, 82).

Embodiment 2

Figure 4:
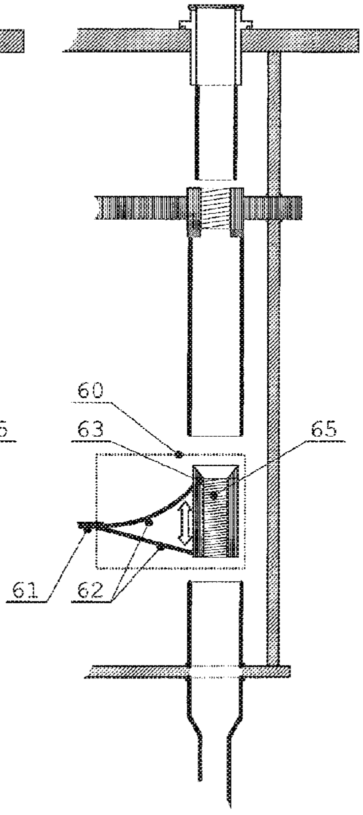
FIG. 4 represents another embodiment of the thermalization block enabling movement of the thermalization block as a whole relative to the cryostat.

FIG. 4 shows another embodiment of the thermalization block (60) according to the subject invention. At variance with Embodiment 1, the non-flexible thermal link (61) is not directly connected with the thermalization point (63) as there is an elastic thermal link (62) joining the non-flexible link (61) with the thermalization point (63). Elastic thermal link can be produced by any means known in the prior art providing that it simultaneously enables axial movement of the thermalization point (63) relative to the guiding tube (72) or to the guiding tube (73). One of these simple means involves forming one or more elastic thermal links, distributed in radial symmetry with respect to the thermalization point (63) and connected to the non-flexible thermal link (61), thus minimizing the radial component of the thermalization point (63) path in its relative movement with respect to the guiding tubes (72, 73).

Similarly as with Embodiment 1, the thermalization point (63) is preferably shaped in the form of a copper cylinder comprising a conical port facing the guiding tube (72), positioned exactly beneath said guiding tube (72), and involving an axial bore with the internal thread (65), shown in FIG. 4.

In Embodiment 2 the guiding tubes (71, 72, and 73) and the thermalization point (63) are positioned along the same vertical axis extending from the sample holder tube (70) down to the space in between the coils (81, 82).

Embodiment 3

Figure 5:
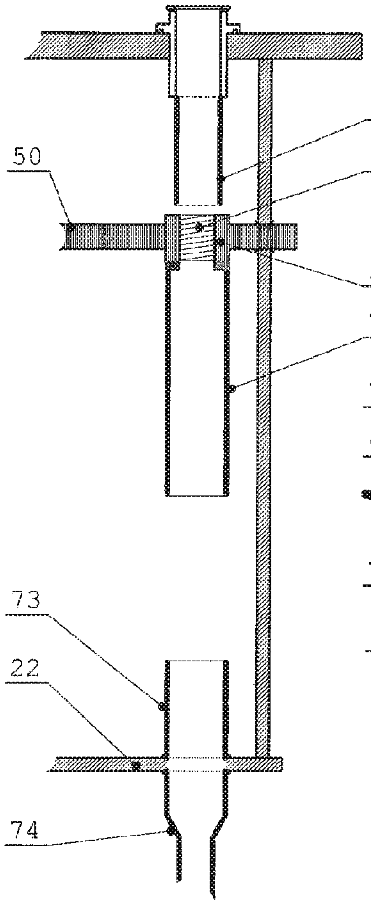
FIGS. 5-8 refer to the third embodiment of the subject invention comprising a movable thermalization block.
Figure 6:
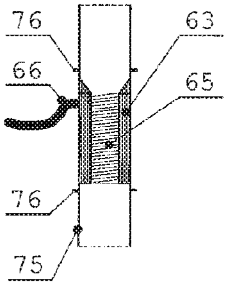

Embodiment 3, shown in FIGS. 5-8, significantly improves the embodiment 2. Embodiment 3 is characterized by a movable tube (75) integrating the thermalization point (63) with the thread (65) in its interior, as illustrated in FIG. 6. The movable tube (75) is made out of a low heat conduction material, e.g., fibreglass, in such a way that there are two butt rings (76) and a flexible thermal link (66) connected to the non-flexible thermal link (66) being in thermal contact with the 2nd PTR stage (34). The flexible thermal link (66) is preferably made out of a copper braid but there could be other possible choices for the link material. It is important that the flexible thermal link (66) does not prevent free movement of the movable tube (75) together with its thermalization point (63) and that it features good thermal conductivity.

Figure 7:
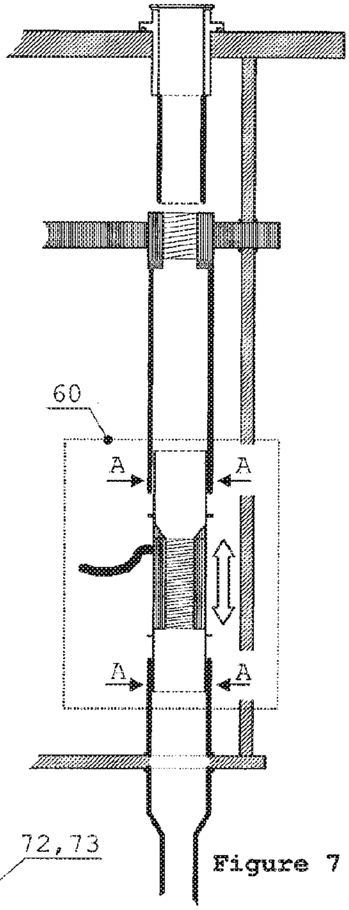

The construction detail shown in FIG. 6 is inserted during final assembly into the set-up shown in FIG. 5 resulting with a set-up schematically shown in FIG. 7.

Figure 8:
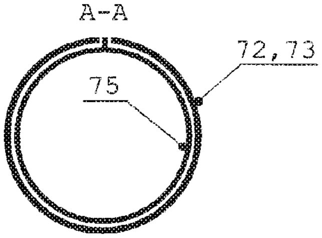

The latter construction of the thermalization block (60) enables axial movement of the tube (75) inside its guides (72, 73) but only in-between the butt rings (76). The butt rings (76) stuck on the guides' edges (72, 73), defining the maximal distance of the axial travel. The problem of enabling only axial but not radial movement of the tube (75) can be solved by several means known in the prior art—one of the certainly simplest is shown in FIG. 8 showing the cross-section A-A from FIG. 7.

As the tube (75) diameter is somewhat smaller than the internal diameter of the guides (72, 73), said tube (75) can be equipped with a pin to fit the gap formed in the guiding tubes (72, 73). One has to point out that the role of the gap/pin combination is to enable a free vertical sliding of the tube (75) but in such a way that the rotation of the tube (75) round its axis would not be possible. This is the way how the thermalization point (63), movable in the direction designated by arrow in FIG. 7, is designed.

In Embodiment 3 of this invention the guiding tubes (71, 72, 73) and the thermalization point (63), as situated in the moveable tube (75), are aligned along the same vertical axis extending from the sample holder tube (70) down to the region between the coils (81, 82).

The constructive materials utilised for the thermalization points (52) and (63) has to be the same as the material used in construction of the sample holder thermalization points. In practice, the most common is copper while the use of dissimilar materials is not permitted because of different coefficients of thermal dilatation, potentially introducing restrictions in moving sample holder inside the cryostat thermalization points.

Sample Holder Preferred Embodiment

Each of said Embodiments 1, 2 and 3 is accompanied by a compatible sample holder. The sample holder, as well as the mode of its application, will be described in the example of the most advanced embodiment.

Figure 9:
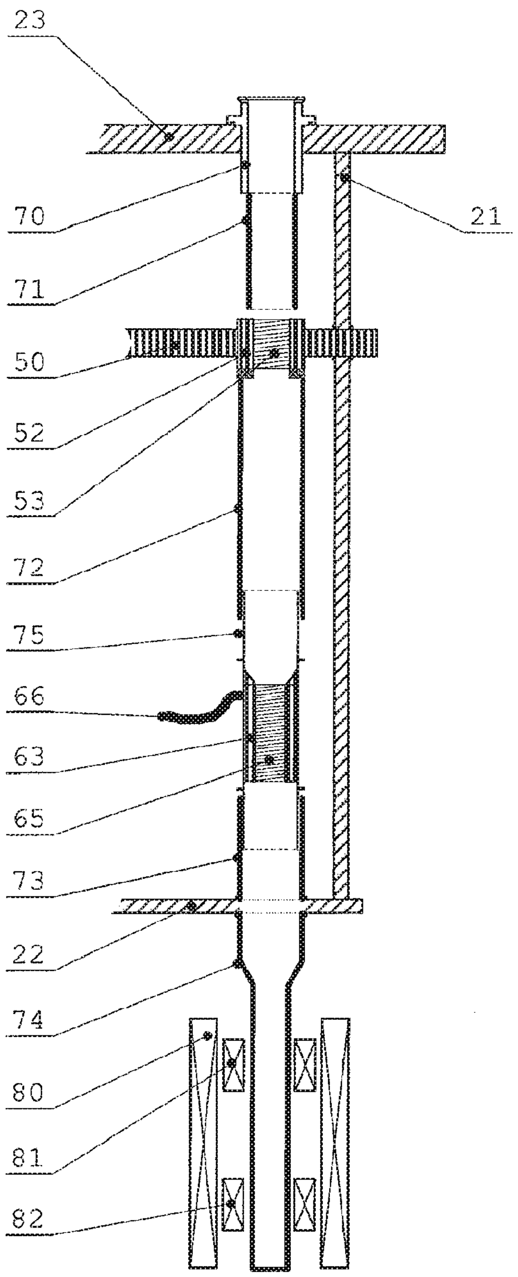
FIG. 9 shows a measuring segment of the cryostat shown in the FIG. 7 comprising compatible sample holder shown in FIG. 10.
Figure 10:
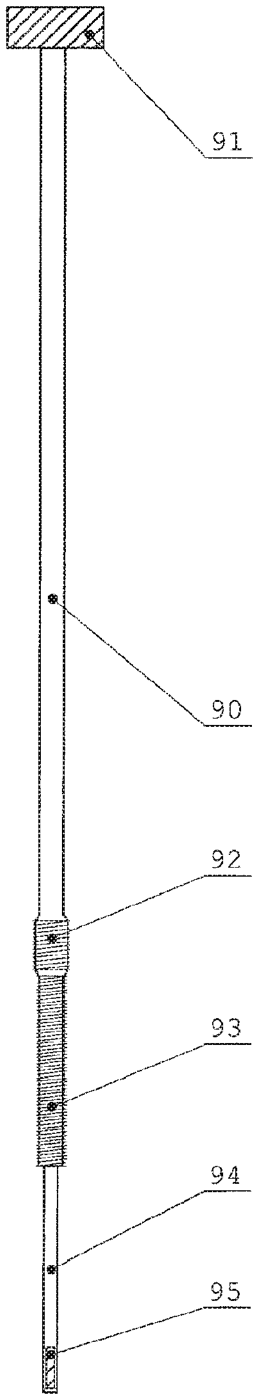

FIG. 9 shows a part of the cryostat in Embodiment 3, taking part in actual measurements. A compatible sample holder is shown in FIG. 10. The sample holder consists of a sample holder body (90), made as a tube out of a preferably low heat conduction material, which also houses, if necessary, the electrical leads needed, e.g., for thermometry, as well as for transport of other sorts of electrical signals; additionally, the sample holder body (90) can also play the role of the waveguide—or fibre optics—conduit/shield. On top of the sample holder body (90) there is a manipulation handle (91), and immediately below it (omitted in the Figures) there, could be an appropriate connector for said electrical leads, waveguides or fibre optics. On other side of the sample holder body (90) there are two joined thermalization points (92, 93) such that the thermalization point (92) is equipped with a thread being, in turn, compatible with the screw (53) in the recondenser (50) thermalization pint (52). Thermalization point (93) is equipped either with a screw compatible with the thread (65) or with a sliding surface compatible with the sliding surface (64) shown in FIG. 2.

One has to point out that the diameter of the thermalization point (93) has to be smaller or equal to the diameter of the thermalization point (92).

The role of the thermalization point (92) is in thermalization of the sample holder to the temperature of the thermalization point (52), linked to the PTR 1st stage, while the role of the thermalization point (93) is in thermalization of the sample holder to the temperature of the thermalization block (60), and linked to the PTR 2nd stage.

Thermalization points (92, 93) and the threads/screws and the related surfaces are made out of good thermal conductors, e.g., copper or copper-based alloys.

Beneath the thermalization point (93) there is a sample holder top (94) with a sample (95) mounted thereon. The sample holder top is made out of the high thermal conduction material, being simultaneously neutral for magnetic measurements, e.g., sapphire. Geometry of the sample holder top (94) enables a non-contact free entrance into the tube (74) space inside the horizontal layer of the measuring coil (81)—particularly concerning AC susceptibility measurements.

In case of measurements not involving magnetic fields, e.g., the temperature dependence of resistivity, the sample holder top (94) can be much shorter and made out of, e.g., copper, in such a way that it as close as possible to the thermalization point (93).

Method for Sample Holder Thermalization

A method for sample holder thermalization is shown in FIGS. 11-16 and will be illustrated for the particular case of the AC susceptibility measurements whereas the thermalization block (60) reproduces Embodiment 3 of the subject invention.

A method of inserting the sample holder in a sample-replacement air-lock (77) chamber is not shown in the Figures as such method is known in the prior art. The sample replacement air lock (77) chamber is shown schematically in FIG. 1. It is positioned exactly above the sample holder tube (70). In vertical movement of the sample holder, which is partially exposed to air above the top of the air-lock (77), no degradation of the achieved vacuum in the vacuum chamber (20) takes place.

According to the subject invention, in using the cryostat one assumes good vacuum inside the vacuum chamber (20), at the order of $10^{-3}$ mbar, as well as thermal stability of all PTR stages. This means that the thermalization points (52, 63) have reached appropriate stabile temperatures monitored by the use of built-in temperature sensors, as well as by the use of additional sensors and controllers built-in in PTR.

In this example it is assumed that the thread of the sample holder thermalization point (93) is compatible with the thread (65) of the thermalization point (63). In case that all thermalization points are made of copper it is possible to realize the 'Cu—Cu screw' mechanical-thermal link of the thermalization point (92) with the thermalization point (52) and of the thermalization point (93) with the thermalization point (63).

Figure 11:
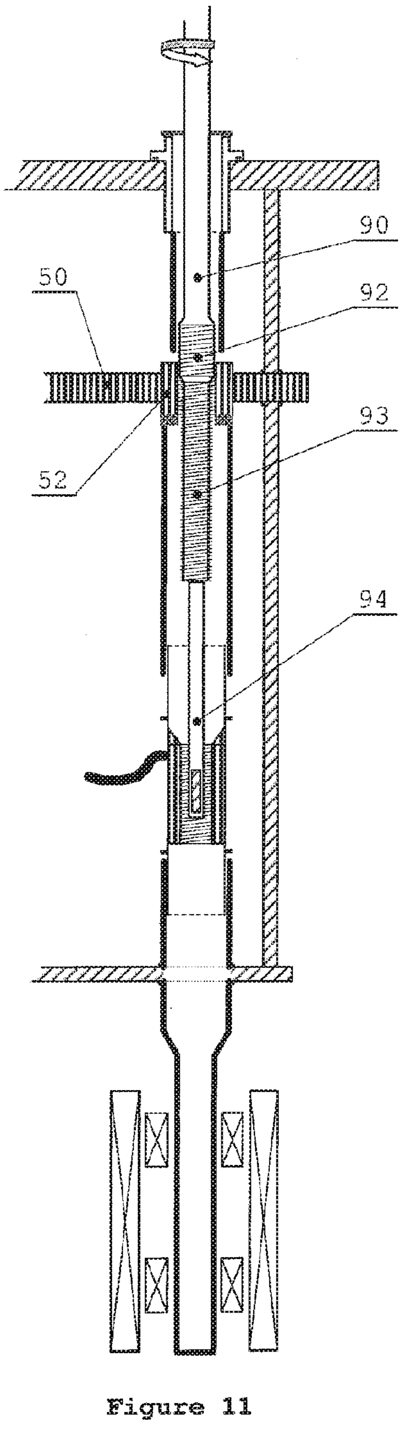
FIGS. 11, 12, 13 and 14 show the means of precooling and sample holder positioning into its final measurement position.
Figure 12:
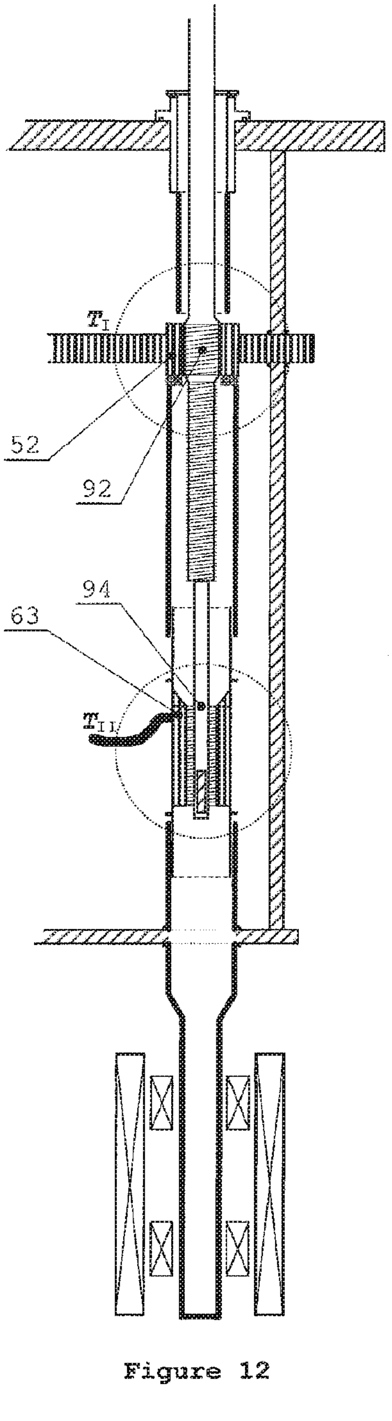
Figure 13:
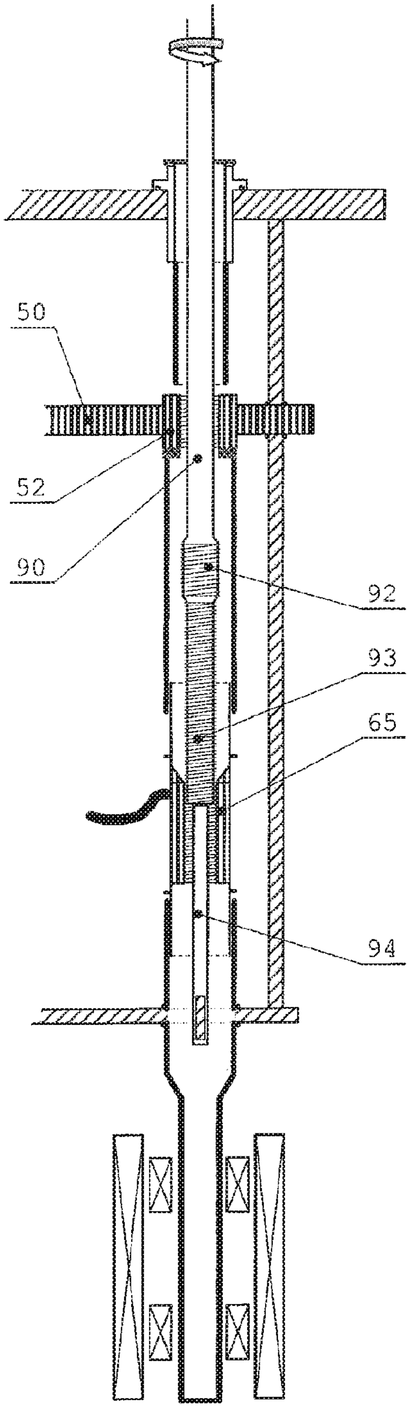

FIG. 11 shows the incipient moment of the formation of the mechanical link, e.g. of the 'Cu—Cu screw' type, to be realized between the thread of the thermalization point (92) and the thermalization point (52) made in the recondenser (50). The latter situation represents the initial phase of the sample holder pre-cooling, reaching maximal efficiency after a complete thread overlap, as shown in FIG. 12, wherein the recondenser (50) is at the 1st stage (31) PTR temperature $T_I$. One has to point out that the big mass of already thermalized recondenser (50), as well as its big thermal capacity with respect to the sample holder, and a good thermal contact of the 'Cu—Cu screw' type, significantly improves the sample holder pre-cooling efficiency via the thermalization point (92).

Favourable design of the sample holder not only realizes the proper cooling, by the use of the mechanical link of the 'Cu—Cu screw' type via the thermalization point (92) thread, but also—see FIG. 12—enables an additional cooling enhancement by radiation, provided that the top of the sample holder (94) is positioned exactly inside the thermalization point (63) at the temperature $T_{II}$ of the 2nd PTR stage.

Figure 14:
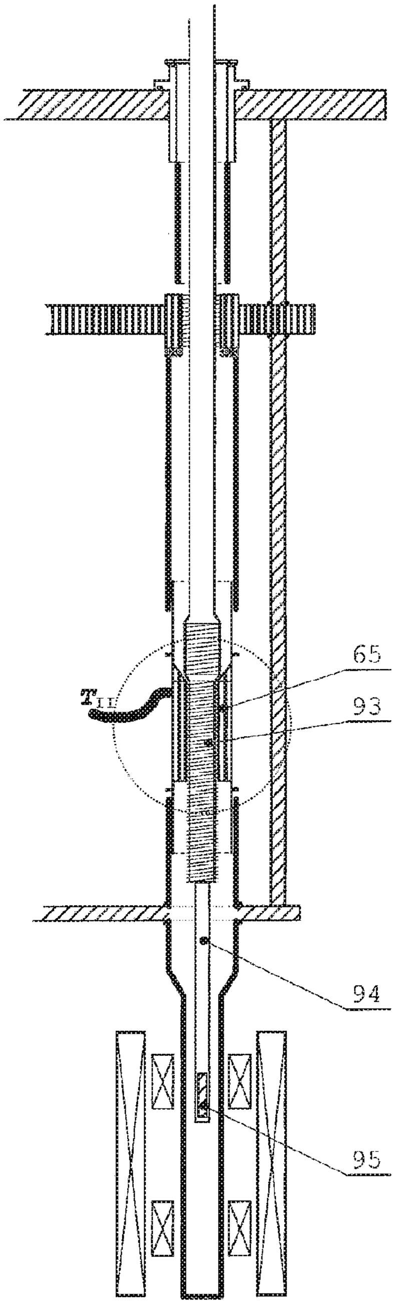

The cooling rate of the sample holder is monitored by the use of built-in thermometry. Upon notifying a slowing down of the cooling rate the second cooling stage, shown in FIGS. 13 and 14, sets in. It is utilized by turning of the manipulation handle (91) further away so that the thread on the thermalization point (92) leaves the thermalization point (52) and the sample holder as a whole lowers down inside the cryostat enough that the thermalization point (93), formed as a screw, enters the threaded thermalization point (63), where it fits the compatible thread (65) therein. By further turning the handle (91) the thermalization point thread (93) completely fills the compatible thread (65), as shown in FIG. 14. In this way a direct 'Cu—Cu screw' thermal link of the sample holder and the PTR 2nd stage at temperature $T_{II}$ is established.

In this way a part of the first technical problem is solved—requirement for the construction of the two-stage PTR-based cryostat offering an efficient sample holder pre-cooling.

For most of the measurements, taking place in absence of applied magnetic field, the operator waits until the lowest temperature of the system has been reached and initiates measurement in the way well-known to the average expert user in the field.

Sample Holder Positioning Method in the Measuring Field

Figure 15:
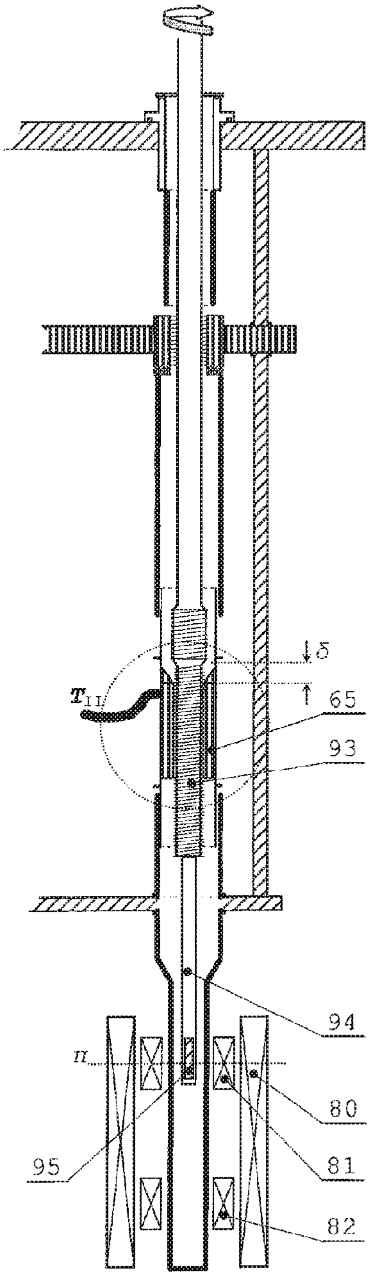
FIGS. 15 and 16 show some of the possible means of positioning the sample holder tip inside the measuring coils in the design III.
Figure 16:
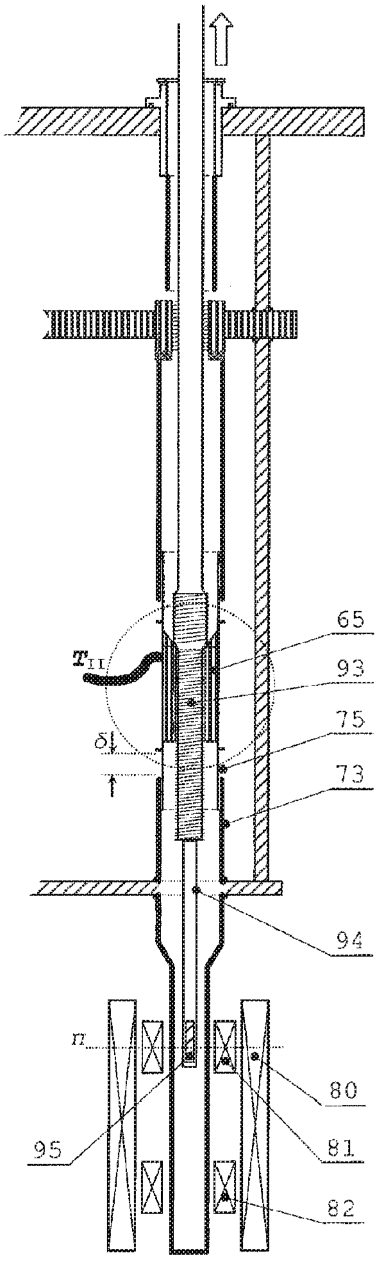

For the sake of AC susceptibility measurements the sample (95) has to be additionally positioned inside the measuring coil (81). FIGS. 15 and 16 shows the two possible modes of adjusting the vertical sample position in Embodiment 3 of the subject invention.

To do that one unscrews the thermalization point (93) from the thread (65), by the use of the handle (91), creating the height δ—see FIG. 15—and reaching the sample position in the plane ideal for taking measurements designated in the Figures with π.

The second possible version is movement of the thermalization block (60) as a whole, more precisely of the thermalization point (93), well-linked by the thread (65) to the thermalization point (63), in upward direction for some height δ, as shown in FIG. 16, thus again achieving sample position in the plane ideal for taking measurements π.

An average expert in the field will understand that relative movement of the thermalization point (93) inside the thermalization block (60) for a vertical distance δ can be achieved in the remaining embodiments of the invention in the following ways:

- in Embodiment 1 of the invention—exclusively by moving the thermalization point (93) inside the sliding surface (64); or by unscrewing the thermalization point (93) from the thread (65) of the thermalization point (63); and
- In Embodiment 2 there are two possible ways: or by unscrewing the thermalization point (93) from the thread (65) or by moving the thermalization block (60) linked to the holder as a whole, to achieve the desired vertical position.

By doing this the second part of the first technical problem—request for a free vertical positioning of the sample—is accordingly solved, in particular for AC susceptibility measurements comprising measuring coils in fixed position.

INDUSTRIAL APPLICABILITY

Cryostat with the improved thermalization of the sample holder solves, according to the present invention, the three technical problems involved and improves construction of the modern cryostat for measurements in the field of solid state physics, in particular of AC susceptibility with increasing sensitivity, owing to elimination of the parasitic effects and provisions for external adjustment of the sample position in the applied magnetic field.

REFERENCES

10—dewar
11—region above the boiling fluid

12—surface of the boiling fluid
13—boiling fluid
14—tube to 11
20—vacuum chamber
21—vacuum chamber wall
22—vacuum chamber bottom
23—vacuum chamber flange
24—tube to 20
30—PTR unit's head
31—I st stage heat exchanger/regenerator chambers
32—PTR, Ist stage
33—II st stage heat exchanger/regenerator chambers
34—PTR; IInd stage
50—recondenser
51—thermal link 50 and 32
52—thermalization point
53—thread inside 52
60—thermalization block
61—non-flexible thermal link of 60 and 34
62—flexible thermal link of 61 and 63
63—thermalization point
64—contact surface inside 63
65—thread inside 63
66—flexible thermal link to 61
70—sample holder tube
71—guiding tube connected to 70
72—guiding tube connected to 50
73—guiding tube connected to 22
74—closed tube in the coil region
75—movable tube supporting 63
76—butting ring
77—sample replacement chamber (air lock)
80—coil for magnetic field forming
81—measuring coil
82—measuring coil
90—sample holder body
91—manipulation handle of 90
92—sample holder thermalization point
93—sample holder thermalization point
94—sample holder top
95—sample

The invention claimed is:

1. A cryostat with a PTR cooling and a two-stage thermalization of a sample holder, said cryostat comprising a dewar, a vacuum chamber with a tube for the vacuum chamber evacuation and a two-staged PTR cooling unit partially positioned inside the vacuum chamber, wherein said vacuum chamber is partially immersed in a boiling fluid, whereby said vacuum chamber further comprises:

a PTR 1st stage connected to a recondenser by the use of a thermal link, wherein said recondenser partially penetrates through walls of the chamber into the dewar region above a fluid level, wherein the recondenser comprises an integrally built thermalization point with an internal thread and guiding tube; and a PTR 2nd stage thermally linked to a thermalization block by the use of a non-flexible thermal link, wherein said thermalization block is thermally isolated from the guiding tubes and comprises a thermalization point, wherein said thermalization block enables vertical positioning of the sample holder with respect to the rest of cryostat without breaking the thermal contact with the thermalization point; while outside the vacuum chamber, in the fluid, there are situated measuring coils and a coil for the magnetic field forming, positioned coaxially with a closed tube, wherein the interior of said closed tube extends the guiding tubes positioned inside the vacuum chamber, wherein there is vacuum both in the closed tube and in the vacuum chamber; while the cylindrical symmetry axes of the closed tube, the guiding tubes and the thermalization points overlap with the vertical cryostat axis passing through a tube of a sample replacement chamber constructed on a flange.

2. The cryostat according to claim 1, wherein the thermalization block comprises the thermalization point directly linked, by the use of the non-flexible thermal link, to the 2nd PTR stage.

3. The cryostat according to claim 2, wherein the thermalization block comprises:

either a sliding contact surface, or a thread, being compatible with a sample holder's thermalization point and positioned centrally inside the thermalization point, said thread having a diameter smaller or equal to the internal diameter of the thread of the thermalization point.

4. The cryostat according to claim 1, wherein the thermalization block comprises the thermalization point connected to the non-flexible thermal link to the PTR 2nd stage by the use of a flexible thermal link, wherein the thermalization point comprises the centrally positioned thread being compatible with the thermalization point of the sample holder, said thread having a diameter smaller or equal to the internal diameter of the thread of the thermalization point.

5. The cryostat according to claim 1, wherein the thermalization block comprises the thermalization point constructed inside a movable tube with integrated butt rings, wherein said movable tube is positioned inside the guiding tubes by means enabling only axial translation of the moveable tube inside the guiding tubes, wherein the thermalization point is connected by the flexible thermal link to the non-flexible thermal link being in contact with the 2nd PTR stage, wherein the thermalization point comprises a centrally positioned thread being compatible with the thermalization point of the sample holder, said thread having a diameter smaller or equal to the internal diameter of the thread of the thermalization point.

6. A sample holder being compatible with the cryostat of claim 1 comprising the PTR cooling and the two-stage sample holder thermalization, wherein said sample holder comprises: a sample holder body, a manipulation handle, a sample holder top accommodating a sample wherein:

thermalization points are constructed as a separate unit attached to the sample holder body, a thread of the thermalization point is made compatible to the thread of the thermalization point, and the thermalization point of the sample holder is constructed with its diameter being smaller of equal to the diameter of the thermalization point.

7. A sample holder according to claim 6, wherein the thermalization point is constructed:

either as a sliding contact surface having the diameter compatible with the contact surface of the thermalization point, or as a thread being compatible with the thread of the thermalization point.

8. A sample holder according to claim 7, wherein the thermalization point is constructed as an extension of the thermalization point, forming together one unit, wherein said thermalization point comprises a thread being compatible with the threads of the thermalization points.

9. A sample holder according to claim 6, wherein the sample holder comprises means for the relative position adjustment of the sample with respect to the measuring coil implementing at least one of:

via sliding of the thermalization point inside the contact surface; or via unscrewing the thermalization point from the thread of the thermalization point; or via relative axial moving of the thermalization block as a whole, wherein the holder's thermalization point is firmly connected inside the thermalization block to the thermalization point.

10. A sample holder according to claim 7, wherein the sample holder comprises means for the relative position adjustment of the sample with respect to the measuring coil implementing at least one of:

via sliding of the thermalization point inside the contact surface; or via unscrewing the thermalization point from the thread of the thermalization point; or via relative axial moving of the thermalization block as a whole, wherein the holder's thermalization point is firmly connected inside the thermalization block to the thermalization point.

11. A sample holder according to claim 8, wherein the sample holder comprises means for the relative position adjustment of the sample with respect to the measuring coil implementing at least one of:

via sliding of the thermalization point inside the contact surface; or via unscrewing the thermalization point from the thread of the thermalization point; or via relative axial moving of the thermalization block as a whole, wherein the holder's thermalization point is firmly connected inside the thermalization block to the thermalization point.

* * * * *